United States Patent
Takeuchi et al.

(10) Patent No.: US 7,327,467 B2
(45) Date of Patent: Feb. 5, 2008

(54) PHASE MEASURING METHOD AND APPARATUS FOR MEASURING CHARACTERIZATION OF OPTICAL THIN FILMS

(75) Inventors: Seiji Takeuchi, Tochigi (JP); Akiyoshi Suzuki, Tokyo (JP); Minoru Yoshii, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/264,044

(22) Filed: Nov. 2, 2005

(65) Prior Publication Data

US 2006/0055940 A1 Mar. 16, 2006

Related U.S. Application Data

(62) Division of application No. 10/356,231, filed on Jan. 31, 2003, now Pat. No. 7,030,998.

(30) Foreign Application Priority Data

Jan. 31, 2002 (JP) ............................. 2002-024469
Jan. 31, 2002 (JP) ............................. 2002-024471

(51) Int. Cl.
*G01B 11/02* (2006.01)
*G01B 9/02* (2006.01)
(52) U.S. Cl. ............... 356/503; 356/520; 356/521
(58) Field of Classification Search ............ 356/491, 356/492, 503, 504, 520, 521, 630
See application file for complete search history.

(56) References Cited

U.S. PATENT DOCUMENTS

| 5,995,224 A | 11/1999 | de Groot |
| 6,072,581 A | 6/2000 | Stephenson et al. |
| 6,312,373 B1 * | 11/2001 | Ichihara ................. 356/515 |
| 6,417,916 B1 * | 7/2002 | Dengler et al. ......... 356/35.5 |
| 6,469,788 B2 | 10/2002 | Boyd et al. |
| 6,940,604 B2 * | 9/2005 | Jung et al. .............. 356/503 |
| 6,982,796 B2 * | 1/2006 | Sato ...................... 356/521 |
| 7,030,998 B2 * | 4/2006 | Takeuchi et al. ........ 356/521 |
| 2003/0142322 A1 * | 7/2003 | Sato ...................... 356/515 |
| 2003/0144819 A1 * | 7/2003 | Takeuchi et al. ........ 702/189 |
| 2006/0039067 A1 * | 2/2006 | Sato ...................... 359/483 |
| 2006/0055940 A1 * | 3/2006 | Takeuchi et al. ........ 356/521 |

FOREIGN PATENT DOCUMENTS

| JP | 58-16216 | 1/1983 |
| JP | 2000-97620 | 4/2000 |

OTHER PUBLICATIONS

European Communication dated Apr. 19, 2006.
Zhengquan, et al. "At-wavelength metrology of 13nm lithography imaging optics" Review of Scientific Instruments, Feb. 1995.

(Continued)

*Primary Examiner*—Patrick Connolly
(74) *Attorney, Agent, or Firm*—Morgan & Finnegan LLP

(57) ABSTRACT

A phase measuring apparatus for measuring phase characteristics of a film applied onto an object to be measured includes a shearing interference system for providing incident light onto the object or light reflected on the object with shearing interference, a detector for detecting shearing interference information, and a computing unit for calculating the phase characteristics of the film based on the shearing interference information.

20 Claims, 10 Drawing Sheets

OTHER PUBLICATIONS

Visser, et al. "A Shearing Interferometer to characterize EUV optics with a laser plasma source" The International Society for Optical Engineering, p. 733-734, Mar. 2000.

Hegeman, et al. "Experimental study of a shearing interferometer concept for at-wavelength characterization of extreme-ultraviolet optics" Applied Optics, vol. 40, No. 25, pp. 4526-4533, Sep. 1, 2001.

Notice of Reasons For Rejection, which is an English Translation of Japanese Office Action dated Apr. 21, 2004 for JP 2002-024469.

Notice of Reasons For Rejection, which is an English Translation of Japanese Office Action dated Apr. 21, 2004 for JP 2002-024471.

* cited by examiner

PHASE MEASURING METHOD AND APPARATUS FOR MEASURING CHARACTERIZATION OF OPTICAL THIN FILMS

This is a divisional of prior application Ser. No. 10/356,231, filed on Jan. 31, 2003, which is hereby incorporated by reference.

BACKGROUND OF THE INVENTION

The present invention relates to phase measuring methods and apparatuses for optical thin films. The present invention is suitable, for example, for measurements of a phase of an optical thin film applied onto reflection and transmission surfaces of an optical system in an exposure apparatus of a step-and-repeat manner, a step-and-scan manner, etc. for fabricating devices, e.g., semiconductor devices (such as ICs, LSIs, etc.), image pick-up devices (such as CCDs, etc.), and display devices (such as liquid crystal panels, etc.).

Along with the fine device patterns, an exposure wavelength for projecting and exposing a device pattern onto a photosensitive material is becoming shorter and shorter. For example, an exposure wavelength is in transition from KrF (with a wavelength of 248 nm) to ArF (with a wavelength of 193 nm) and $F_2$ laser (with a wavelength of 157 nm), and even EUV light with a wavelength of 13.4 nm has also reduced to practice.

A smaller device pattern is the most important factor that supports the dynamics in the semiconductor industry, and thus the age requiring for the resolution with a critical dimension ("CD") of 0.25 mm for DRAMs has rapidly changed to that of CDs of 180 nm, 130 nm, and even 100 nm. The lithography using an i-line (with a wavelength of 356 nm) as exposure light has never required the resolution with a CD less than a wavelength.

On the other hand, KrF with a wavelength of 248 nm has been applied to the lithography that requires a CD of 180 nm or even 150 nm. The resolution with a CD less than a wavelength is about to reduce to practice by exploiting achievements in improved resists and the super-resolution techniques, etc. Various super-resolution techniques would possibly realize the pattern resolution with a CD of a ½ wavelength in the line and space.

However, the super-resolution technology is often subject to pattern manufacture restrictions, and the most effective way of improving resolution is, after all, to use a shorter wavelength as exposure light and a higher NA for a projection optical system. This fact greatly motivates for shorter wavelengths of exposure light, and has led to a development of the EUV lithography that uses light with a wavelength of 10-15 nm as exposure light.

An optical system that receives EUV light as exposure light may use only limited materials since no materials transmit the EUV wavelength range. In particular, the EUV region does accept transmission type optical elements, but requires reflection type optical elements with optical constant of nearly 1 and low reflectance on their mirror surface. A characteristic of a reflection enhancement film applied onto a mirror is an important factor to secure expected reflectance. The film material is also subject to many restrictions, and the typical fundamental structure is a film (i.e., a multilayer film) of Mo and Si alternate layer. Other multilayers include, for example, Be—Si and Rh—Si multilayers. The film requires 40 multilayer pairs, each pair having a Mo and Si alternate layer, and provides extremely drastic changes of optical characteristics.

Characteristically, a film for the EUV region requires phase (or phase-distribution) control as well as its reflectance. Whenever EUV light reflects on the film, its phase changes. The phase distribution in the film distorts a wavefront that enters a mirror surface, and an offset in cycle length or a film's quality change on the mirror surface would cause (wavefront) aberration. It is thus desirable to measure the film's phase (or phase distribution) as soon as the film is applied onto the mirror surface. It is particularly desirable to measure position-dependent and angle-dependent phase characteristics of the film.

A correction of aberration in a reflection imaging system particularly requires accurate control over not only precise shaping of a mirror plate for its curvature, aspheric amount, etc., but also the performance of a reflection-enhancement multilayer film. The accurate control over the multilayer film requires a phase of reflected light not to greatly change according to reflected positions on the same mirror surface.

Practically, an angle of light incident onto a mirror is so small that incident light mostly rests within an angular distribution range of several degrees at least and about 20-30 degrees at most. Measurements of a phase distribution with various incident angles onto a film on a mirror surface would be difficult due to arrangement restrictions.

Before the reflection imaging system is assembled, it is necessary to elaborate a mirror shape, and check if reflected phases at respective positions on the multilayer film above the mirror surface are pursuant to the design values.

BRIEF SUMMARY OF THE INVENTION

It is an exemplary object of the present invention to provide a phase measuring method and apparatus that may easily and accurately measure angle-dependent and position-dependent phase characteristics, even at an angle close to the normal incidence, of a film applied onto a curved or plane mirror.

A phase measuring apparatus of one aspect of the present invention for measuring phase characteristics of a film applied onto an object to be measured includes a shearing interference system for providing incident light onto the object or light reflected on the object with shearing interference, a detector for detecting shearing interference information, and a computing unit for calculating the phase characteristics of the film based on the shearing interference information.

A phase measuring apparatus of another aspect of the present invention for measuring, based on interference information, phase information dependent upon a position on a film applied onto an object to be measured includes a splitting grating for splitting light from a light source into plural beams, and for introducing the plural beams to the object, a combining grating for combining two beams reflected on the object, and a detector for detecting the interference information based on the two beams that have been combined by the combining grating.

A phase measuring apparatus for measuring, based on wavefront information, phase information dependent upon an angle incident onto a film applied onto an object to be measured includes a reflector for condensing light from a light source with a certain incident angle range, and for introducing the light to the object, and a detector for detecting the wavefront information of the light reflected on the object.

A phase measuring apparatus of another aspect of the present invention for measuring, based on interference information, phase information dependent upon an angle incident upon a film applied onto an object to be measured includes a reflector for condensing light from a light source with a certain incident angle range, and for introducing the light to the object, a splitting grating for splitting light reflected on the object into multiple beams, and a detector for detecting the interference information based on two out of the multiple beams split by the splitting grating.

In the above phase measuring apparatus, the light incident on the object may enter a single spot on the object.

A phase measuring apparatus of another aspect of the present invention for measuring, based on interference information, phase information dependent upon a position on a film applied onto an object to be measured and an angle incident on the film includes a first splitting grating for splitting light from a light source into multiple beams, and for introducing the multiple beams to the object, a combining grating for combining two beams reflected on the object, a detector for detecting the interference information based on two beams combined by the combining grating, a reflector for condensing light from the light source with a certain incident angle range, and for introducing the light to the object, after the first splitting grating and combining grating are retreated from an optical path, and a second splitting grating for splitting light reflected on the object into multiple beams, and the detector detecting the interference information based on two out of the multiple beams split by the second splitting grating.

The above phase measuring apparatus may further include a polarization selector to measure phase information in selected polarized light.

A phase measuring method of another aspect of the present invention for measuring phase information dependent on an angle of incidence onto a film applied onto an object to be measured includes the steps of introducing light to substantially one spot on the object and providing light from the one spot with shearing interference, and partially differentiating, with respect to a position on the film and/or the angle, phase information dependent upon the position and the angle.

An exposure apparatus comprising an optical element whose phase has been measured by the above phase measuring method also constitutes another aspect of the present invention.

A phase measuring method of another aspect of the present invention that detects phase characteristics dependent on an angle incident on a film as an object to be measured includes the steps of introducing light to the object while correlating a position incident on the film and the angle incident on the film with each other, and measuring a phase distribution of the light from the object utilizing shearing interference. The light incident on the object may be convergent or divergent light. The method may further include the step of comparing a wavefront of the light that has not contacted the object with that of the light that has contacted the object. The method may further include the step of separating an optical path for incident light from that for outgoing light using a mirror surface or a pinhole provided at a condensing point of the convergent or divergent light to the object. The method may further include the step of correcting a phase obtained from the phase measuring method, based on a shape of the object that has been measured previously.

A phase measuring apparatus of another aspect of the present invention for measuring phase information dependent upon an angle incident on a film applied onto an object to be measured, based on interference information includes a condenser for condensing light from a light source, a reflector, provided on a condensing point for the light, for reflecting the light and introducing the light that is divergent light to the object, a grating for diffracting the light that has been reflected on the object, and a detector for detecting the interference information based on two beams having offset wavefronts by the grating. This apparatus may further include a corrector for correcting, based on a shape of the object that has been measured, a phase obtained through a measurement by the phase measuring apparatus.

A phase measuring apparatus of another aspect of the present invention for measuring, based on interference information, phase information dependent upon an angle incident on a film applied onto an object to be measured includes a condenser for condensing light from a light source, a grating for diffracting light from the condenser into diffracted beams of multiple orders and for introducing the beams to the object while maintaining a condensed state, a reflector, provided at a condensing point of light reflected on the object, for reflecting two diffracted beams of a specific order, and a detector for detecting the interference information based on the two diffracted beams reflected on the reflector.

In the above phase measuring apparatus, the reflector may serve to separate an optical path for light incident on the object from that for light exiting from the object. The above phase measuring apparatus may correct, based on a shape of the object that has been measured previously, a phase obtained through measurement by the phase measuring apparatus.

A phase measuring apparatus of another aspect of the present invention for measuring, based on interference information, phase information dependent upon an angle incident on a film applied onto an object to be measured includes a condenser for condensing light from a light source, an aperture close to a condensing point of the light, a grating for introducing to the object, the light that has passed the aperture and is divergent light, and a detector for detecting the interference information based on two beams having offset wavefronts, the two beams resulting from the light that has been reflected on the object and diffracted by the grating. The phase measuring apparatus may serve to filter the aperture in the grating.

The above phase measuring apparatus may measure phase information of the film using the interference information obtained by the detector in an optically equivalent system without the object. The above phase measuring apparatus may correct, based on a shape of the object that has been measured previously, a phase obtained through measurement by the phase measuring apparatus.

Exposure apparatuses having an optical element measured by the above phase measuring method and apparatus also constitutes another aspect of the present invention. A device fabrication method comprising the steps of exposing onto a target by using the above exposure apparatus, and developing the exposed target also constitutes another aspect of the present invention. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

An inventive method measures a reflection phase distribution of a (multilayer) film dependent upon a position on the film surface, and that dependent upon an angle of light incident onto the film.

Figure 1:
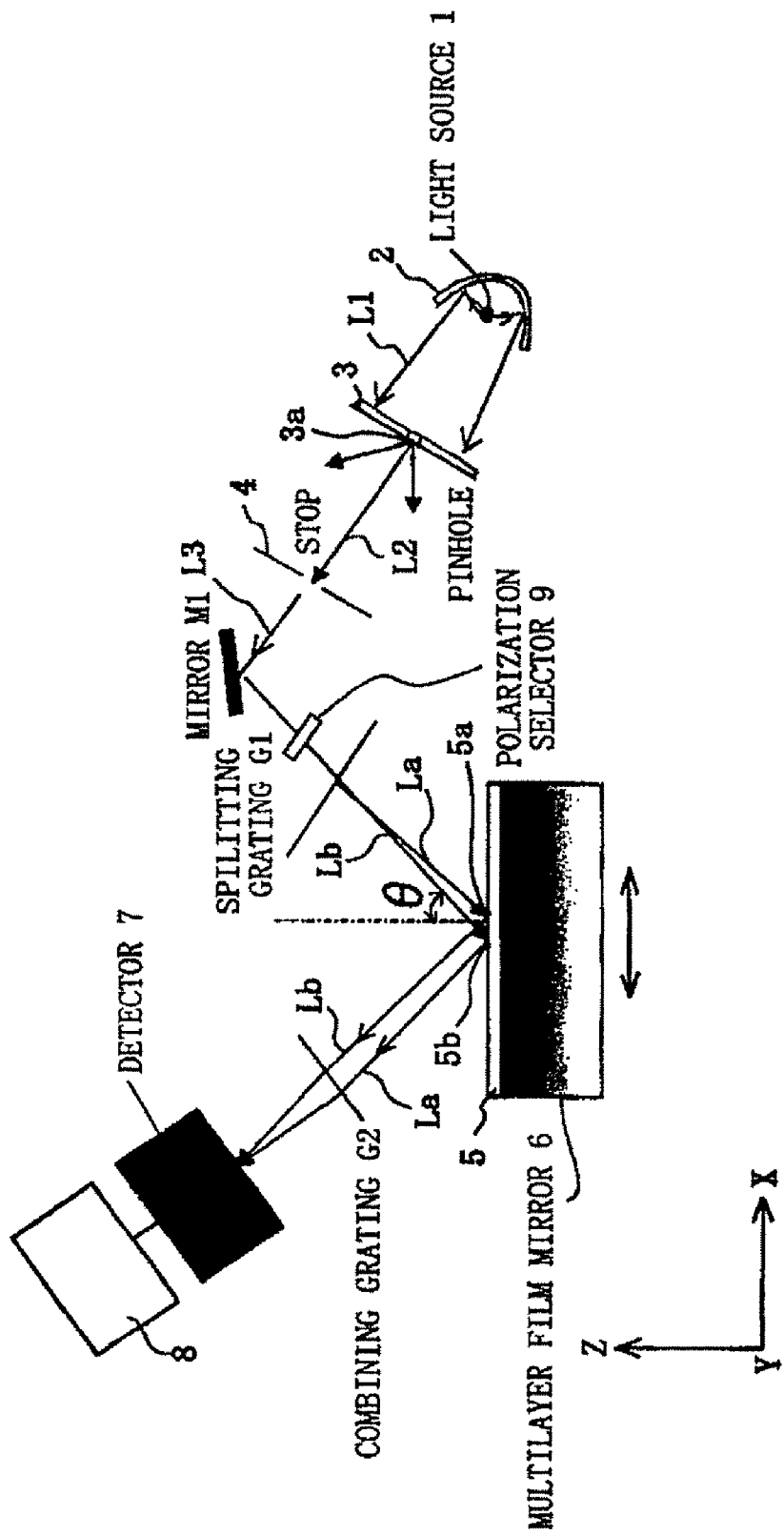
FIG. 1 is a schematic view of principal parts of a phase measuring apparatus for measuring a position-dependent phase characteristic of a first embodiment according to the present invention.
Figure 2:
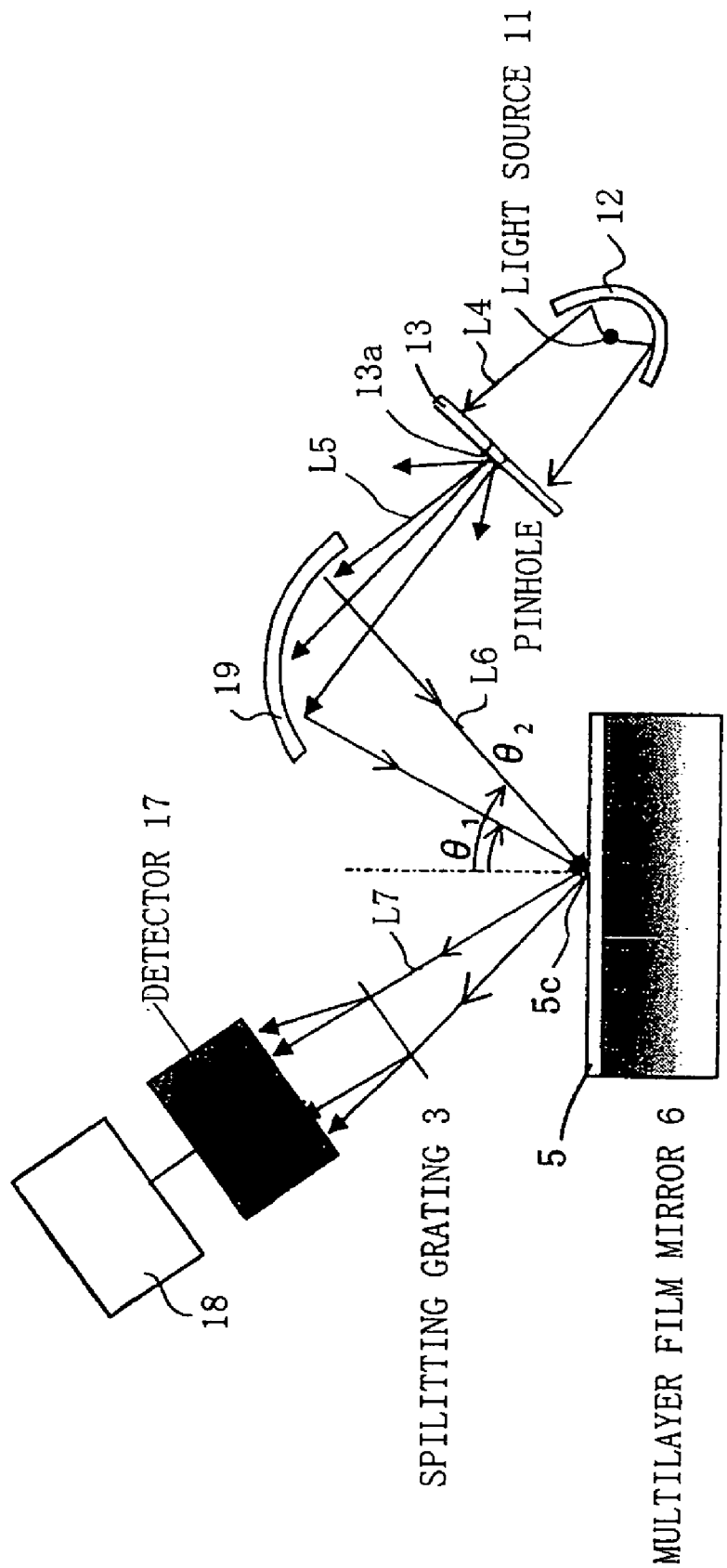
FIG. 2 is a schematic view of principal parts of a phase measuring apparatus for measuring an angle-dependent phase characteristic of the first embodiment according to the present invention.

FIGS. 1 and 2 are schematic views of principal parts of phase measuring apparatuses of a first embodiment according to the present invention for measuring phase information of the film applied on a mirror surface for use with an EUV wavelength region. FIG. 1 is a schematic view of principal parts for measuring a position-dependent reflection phase distribution of the film. FIG. 2 is a schematic view of principal parts for measuring an angle-dependent reflection phase distribution of the film.

This embodiment executes two different measurements with two different apparatuses shown in FIGS. 1 and 2. A description will now be given of the measuring system shown in FIG. 1. Light L1 emitted from a light source 1 is reflected by a mirror 2 that is an ellipsoid, a paraboloid, etc., and passes through a pinhole 3a in a member 3, providing a shaped wavefront from a point light source. The light source 1 uses a laser plasma light source or synchrotron radiation ("SR"). Light L2 from the pinhole 3a is introduced through a stop 4, and turned into a beam L3 with a diameter of about 1 mm. This beam L3 is supplied to a splitting grating G1 via a mirror M1, split into two beams La and Lb, and then irradiated with angles onto slightly offset two points 5a and 5b on an object 6 with a multilayer film 5. Although angles of light La and Lb incident on the film 5 are slightly different, they are regarded as approximately the same angle θ for simplicity purposes.

The incident positions 5a and 5b are regarded as approximately the same positions due to the small difference. A combining grating G2 combines reflected beams La and Lb from the two points 5a and 5b for interference, and a detector 7 such as a CCD, etc. obtains an interference signal. When a wavelength of light from the light source 1 is outside the detectable range for the detector 7, light may be led, e.g., to a fluorescent screen to enable the detector to detect interference information formed on the fluorescent screen.

A computing unit 8 measures the reflection phase distribution of the multilayer film 5 at the incident angle θ of the light by utilizing the interference signal from the detector 7, and by changing relative positions between the object 6 and the measuring system. The position-dependent reflection phase distribution is expressed using x as a position and θ as an incident angle. A position-dependent reflection phase distribution of the film at the position x, i.e., $\Phi(x+\Delta x, \theta) - \Phi(x, \theta)$, corresponds to a phase difference as intensity of an interference signal. $d\Phi(x, \theta)/dx$ is obtained from a minute beam shift amount $\Delta x$ (or a differentially shifted wavefront).

The reflection position distribution $\Phi(x, \theta)$ dependent on a position of the film 5 at the first incident angle θ is calculated by scanning the entire surface on the multilayer film 5 with the beams La and Lb while relatively moving the object 6 and the measuring system, and by integrating it with respect to the position x on the film 5 surface. Gathering of data as two-dimensional signals using spread beams onto the film 5 surface would improve integral phase data connections, and provide accurate measurement results. Alternatively, fast scans and data gathering may be available with a thin beam and a detector having a small light-receiving surface.

The instant embodiment uses the splitting and combining gratings G1 and G2 to measure reflection phase information at each position on the film without an optical surface that forms a reference wavefront.

In FIG. 1, light enters a multilayer film mirror to an extent of positional differentiation, and condenses at an almost single spot. In other words, the light condenses at a substantially single spot with a positionally differentiable size.

Referring now to FIG. 2, a description will be given of a reflection phase distribution of the film dependent upon an angle incident on the film. Light L4 from a light source 11 is reflected on a mirror 12, and goes through a pinhole 13a in a member 13, providing a point light source with a shaped wavefront. Light L5 spreads from the pinhole 13a, and goes as light L6 to a measurement point 5c on the film 5 surface via a mirror 19 that may have elliptical, parabolic, rotationally asymmetrical aspheric surfaces, etc. The light L6 has ranges from a first incident angle $\theta_1$ to a second incident angle $\theta_2$ on the film 5 as an object to be measured. A splitting grating G3 shears light L7 reflected on the measurement point 5c on the film 5, i.e., splits the light L7 into two beams, and allows them to interfere with each other. A detector 17, such as a CCD, detects this interference information.

A computing unit 18 obtains an angle-dependent reflection phase distribution for the incident angles $\theta_1$ to $\theta_2$ at the measurement point 5c using a signal from the detector 17. The angle-dependent reflection phase distribution of the film, i.e., $\Phi(x, \theta_1+\Delta\theta) - \Phi(x, \theta_1)$, corresponds to a phase difference as intensity of an interference signal. $\Delta\theta$ is determined by an offset angle of the light L7, and the above term represents a value at the first incident angle. Since the first incident angle $\theta_1$ ranges, this value is sought within a range from the first incident angle $\theta_1$ to the second incident angle $\theta_2$. For minute $\Delta$, $d\Phi(x_1, \theta)/d\theta$ is measured at the first position $x_1$.

The light L6 scans the entire surface on the multilayer film 5 by relatively moving the object 6 and the measuring system, and provides incident angle characteristics over the entire surface. An incident angle distribution $\Phi(x_1, \theta)$ at the position $x_1$ is obtained by differentiating this integral value.

The instant embodiment thus introduces the light L6 with a certain incident angle range to the film 5 surface via a condenser optical system (or mirror) 19 with a certain NA, uses the grating G3 to shear the wavefront of the light reflected on the film 5 surface for interference, and obtains phase information dependent on the incident angle on the film 5 based on interference information.

This embodiment obtains a relative phase of reflected light at a certain incident angle $\theta$ as a function of a position on a mirror 6 (or film 5) using first measurement data from the system shown in FIG. 1, and a relative phase of a reflection at each position as a function of an incident angle $\theta$ using the second measurement data from the system shown in FIG. 2. These relative phase measurements are used to correlate entire data. For example, positional phase data is calculated as required at a third incident angle $\theta_3$ between the first and second incident angles $\theta_1$ and $\theta_2$.

Since certain types of mirrors to which a film is applied have an angle-dependent distribution of incident light that contributes to actual imaging only limited positions on the mirrors, it might be unnecessary to measure the entire surface with the incident angle $\theta_1$ for such mirrors.

The measuring apparatus of the instant embodiment uses a variable angle of light incident on the film 5 surface. The first measurement system shown in FIG. 1 measures while changing an incident angle according to locations, and calculates a relative phase difference at a reference incident angle near the location. On the other hand, the second measurement system shown in FIG. 2 measures while changing the incident angles $\theta_1$ and $\theta_2$ and maintaining a reference incident angle at each location used for the first measurement system to be always between the incident angles $\theta_1$ and $\theta_2$. Thus, the reference incident angle is used to connect positional relative phases and angular relative phases in the incident angular range that includes the reference incident angle in the second measurement system.

In the structure shown in FIG. 2, the condenser optical system 19 may be made replaceable with the stop 4, the mirror M1, and the splitting grating G1 shown in FIG. 1, and the splitting grating G3 may be made replaceable with the combining grating G2 shown in FIG. 1. Preferably, each of these members may be made replaceable depending upon the object and accommodated in one apparatus.

Each of the splitting and combining gratings G1 and G2 may be a transmittance type or a reflection type. If any member may be used instead of the grating as long as it serves to split a beam or combine beams.

For example, the two gratings G1 and G2 with the same lattice constant are arranged relative to the plane mirror M1 in FIG. 1 so that they provide the same wavefront incident angle to the detector 7. FIG. 2 may be modified such that each wavefront has the same angle in FIG. 2 by piling two gratings when an angle of interference wavefront is large.

The above embodiment may scan the film surface with slightly defocused light without condensing light onto the film 5 surface. This would provide phase data in which a position and an incident angle are sheared in a complex manner, i.e., $\Phi(x+\Delta x, \theta_1+\Delta\theta)-\Phi(x, \theta_1)$.

$\partial^2 \Phi(x_1, \theta)/\partial\theta\partial x$ is obtained for a minute light shift amount. Integral of measurement data with a position and an angle may provide position-dependent and angle-dependent phase distribution data.

The above embodiment may insert a polarizer in an illumination optical system to measure a reflection phase distribution for desired polarized light. A concrete position for the polarizer is, e.g., before or after the splitting grating G1 in FIG. 1, and after the condenser mirror 19 in FIG. 2. Insertion of a polarizer just after reflection would also provide a similar effect. A insertion position for a polarizer for this case is, e.g., before or after the combining grating G2 in FIG. 1, and before or after the splitting grating G3 in FIG. 2.

A polarizer may use, for example, a transmittance type as introduced in "Development of EUV free-standing multilayer polarizers", W. Hu, M. Yamamoto, and M. Watanabe, Proc. SPIE Vol. 2873, pp. 74-77, or a reflection type that uses a multilayer mirror at an incident angle of 45°, which is generally designed and manufactured as a high reflection film for vertical incidence.

The measurement of a film's phase distribution in the above embodiment is applicable not only to the EUV light, but to visible light as well.

Figure 3:
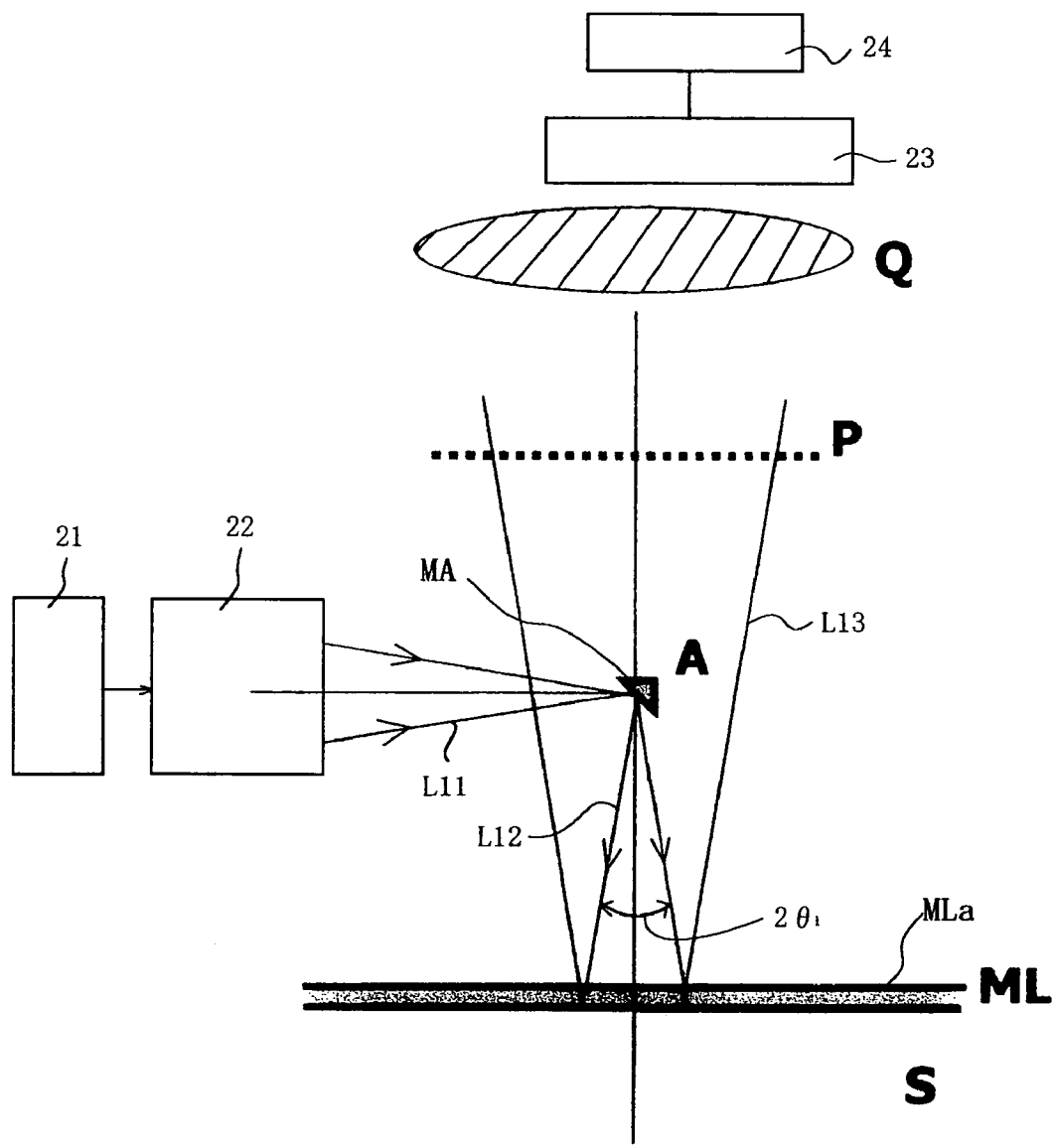
FIG. 3 is a schematic block diagram of principal parts for a phase measuring optical apparatus of a second embodiment according to the present invention.

FIG. 3 is a schematic view of principal parts for a phase measuring optical apparatus of a second embodiment according to the present invention.

This embodiment measures phase characteristics based on an angle of light incident on a multilayer film ML applied onto a plate S (although the film may have a single layer). A light source 21 for measurement may be an undulator, and a condenser optical system 22 converts light from the light source 21 into convergent light L11 that condenses at a point A. The condenser optical system 22 may includes such an optical element as a parabolic mirror for converting parallel light into convergent light.

The condenser optical system 22 may use plural mirrors. It may use an ellipsoidal mirror to obtain desired convergent light in using a light source like a point light source.

A small mirror MA is provided as a reflector at the point A. The convergent light L11 is reflected on the mirror MA, and enters as divergent light L12 an object surface MLa, which is formed by applying the multilayer film ML onto a plate S. The multilayer film ML on the object surface MLa receives the divergent light L12 with a spread angle $2\theta_1$.

Figure 4:
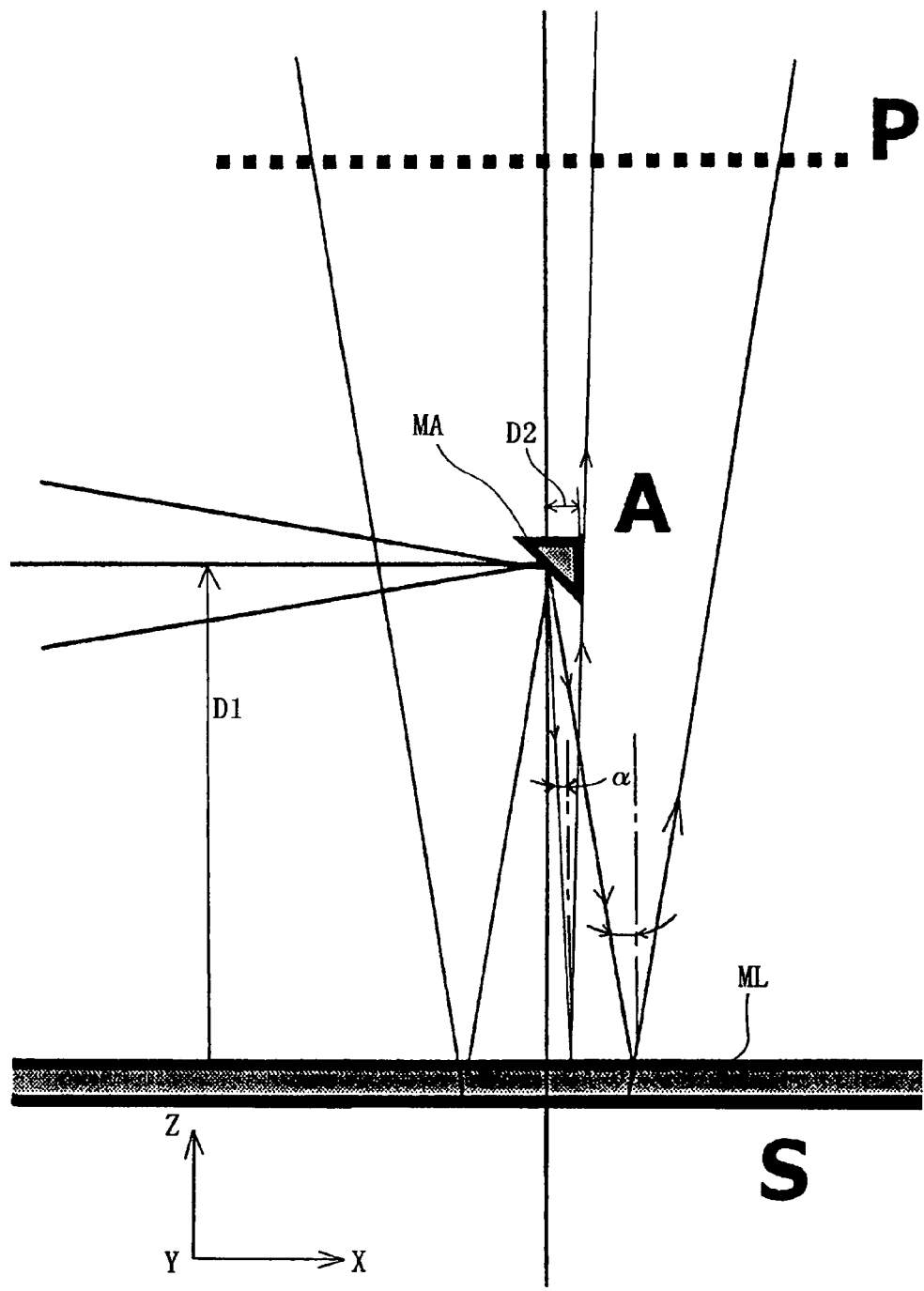
FIG. 4 is a partial enlarged view of FIG. 1.

As shown in FIG. 4, a minimum value a of the angle of the light L12 incident on the film ML is given as follows:

$$\alpha = \tan^{-1} \cdot \frac{D2}{2 \cdot D1}$$

where D2 is a distance from the point A to a mirror MA's right end in a direction parallel to the film ML, and D1 is a distance from the point A to the film ML in a direction perpendicular to the film ML. A similar calculation is applicable to light that is reflected at the point A and on the film ML, and passes on a mirror MA's left end in FIG. 4.

Thus, an incident angle ranges $\alpha$ to $\theta_1$. In general, the angle $\alpha$ may be made very small down to one that may be regarded as approximately normal incidence.

The light L12 incident on the film ML on the object surface MLa reflects with a different phase skip according to incident angles. A constant skip amount of the film ML's phase (or phase distribution) would not distort the wavefront of the light L13. However, the reflected light L13 exhibits a gained or delayed phase according to incident angles, and possesses a phase distribution different from the incident wavefront when the light L12 has a phase distribution.

Since no transparent materials are available for the EUV region, an EUV optical system may use only limited optical elements due to selectable material limitations. In particular, no refractive elements, such as a lens, are feasible, and only a grating may serves as a beam splitter for splitting light.

The inventive optical system employs shearing interference to measure a phase distribution of the wavefront of light reflected on the film ML. More specifically, the light L13 reflected on the film ML travels across the mirror MA position, and a grating P diffracts the light and splits its wavefront at a position where the incident light L11 and reflected light L13 are completely separated.

The instant embodiment forms an interference fringe at a position Q1 through interference between 0-th order light and $1^{st}$ order light among split wavefronts. The instant embodiment then obtains the interference fringe using a detector 23 provided at the position Q1, and analyzes the interference information using a computing unit 24, thereby measuring the phase distribution of the reflected wavefront. Angle-dependent phase characteristics of the reflection film are calculated based on a known correlation between the incident angle and the incident position on the reflection film and the wavefront measurement result.

Desired interference-fringe information is obtained from concurrent other interference fringes of high order diffracted light using electric frequency filtering and the like.

The wavefront information based on the interference fringe obtained at the position Q1 includes a phase distribution of the wavefront of the incident light L11. For example, even if the light L11 incident on the point A possesses a wavefront of an ideal aspheric wave, the light L12 after the point A exhibits a distorted wavefront deviating from the ideal aspheric surface, depending upon the film that is applied to the reflection surface of the mirror MA at the point A and has undesirable phase characteristics.

In order to calibrate the distortion of the light L12 as the incident wave, the instant embodiment has previously measured a phase distribution of the incident wave's wavefront without the object ML, and subtracts it as a reference wavefront from the wavefront measured with the object surface MLa.

Figure 5:
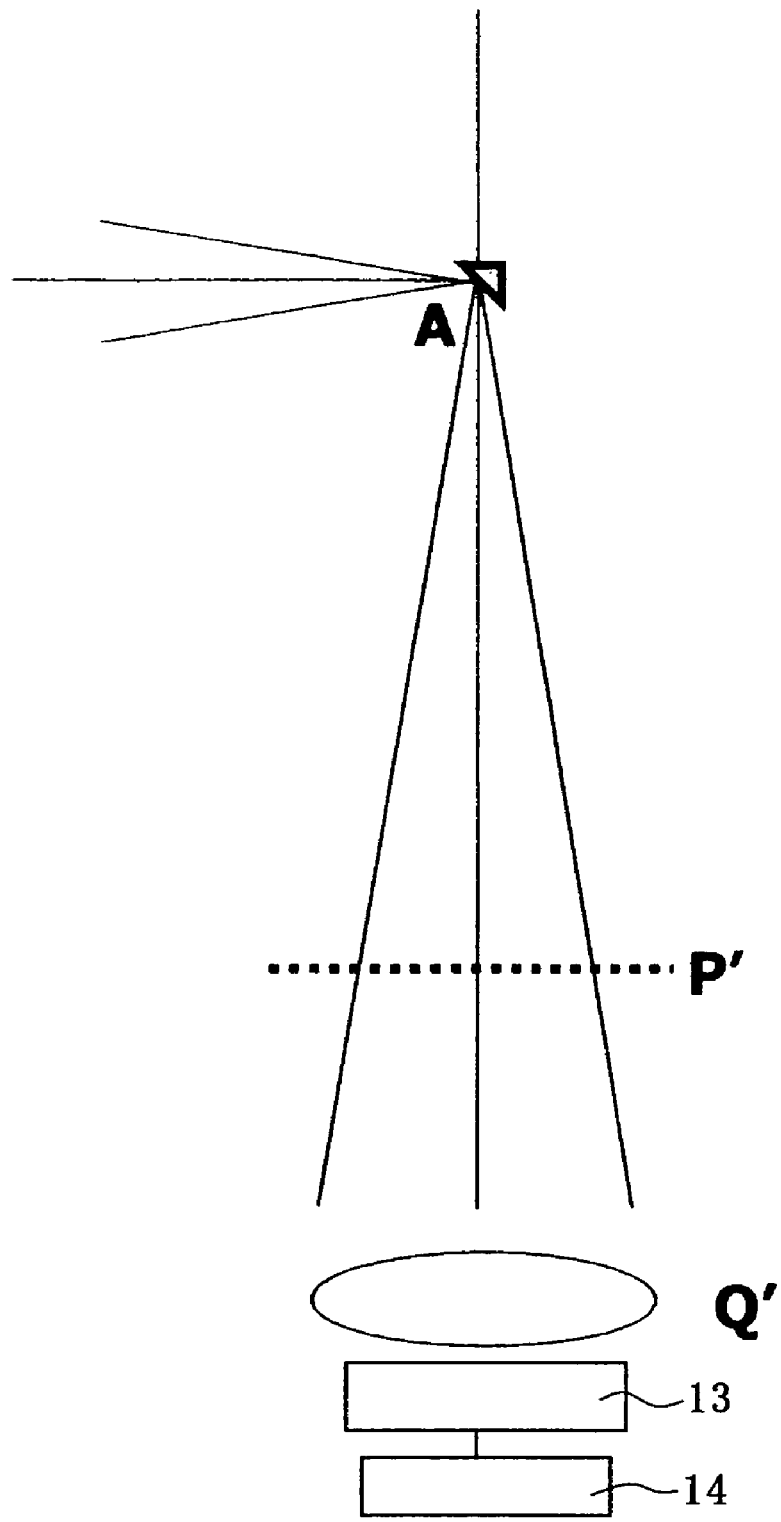
FIG. 5 is a schematic block diagram for explaining a method for calibrating distortion of incident wave of the second embodiment.

FIG. 5 is a schematic view for explaining this approach. FIG. 5 sets a distance from the point A to a grating P' equal to a distance from the point A to the point P through the object ML, and a distance from the point P' to a point Q' equal to a distance from the point P to the point Q. These equalized distances provide an accurate offset for the measurement system shown in FIG. 3, and an accurately calculated phase distribution of the object even when the incident wavefront includes comparatively large distortion in its wavefront.

Preferably, the gratings P and P' shown in FIGS. 3 and 4 are the same for accuracy.

The system shown in FIG. 3 could not measure the reflection characteristics around the normal incidence, which has been usually difficult, if arranging the mirror at a position shielding the normal incident ray. However, the instant embodiment limits an immeasurable angle to only a small light-shielding part (with a distance D) on the reflection surface of the mirror MA as shown in FIG. 4, and therefore may achieve the measurement much closer to the normal incidence. The mirror MA arranged at the condensing point A reduces a size of its reflection surface, and produces a spatial frequency filtering effect.

Due to spread light over an object in the measurement in this embodiment, a phase term produced according to object surface shapes sometimes affects an observation of an interference fringe. A phase resulting from the surface shape is different than and should be eliminated from that resulting from the film. However, no surface-shape corrections are needed for small spread light and an almost flat surface shape. A necessity of correction depends upon a required level of accuracy, but may be determined based on information on the measurement arrangement and the object. When it is previously determined that a surface-shape error affects a measurement error, the accurate measurement of the film's phase is measured accurately by measuring the surface shape in advance using an interferometer and the like, and reflects the surface-shape error as a correction value into the measurement result. This approach is similarly applicable to other subsequent embodiments.

Figure 6:
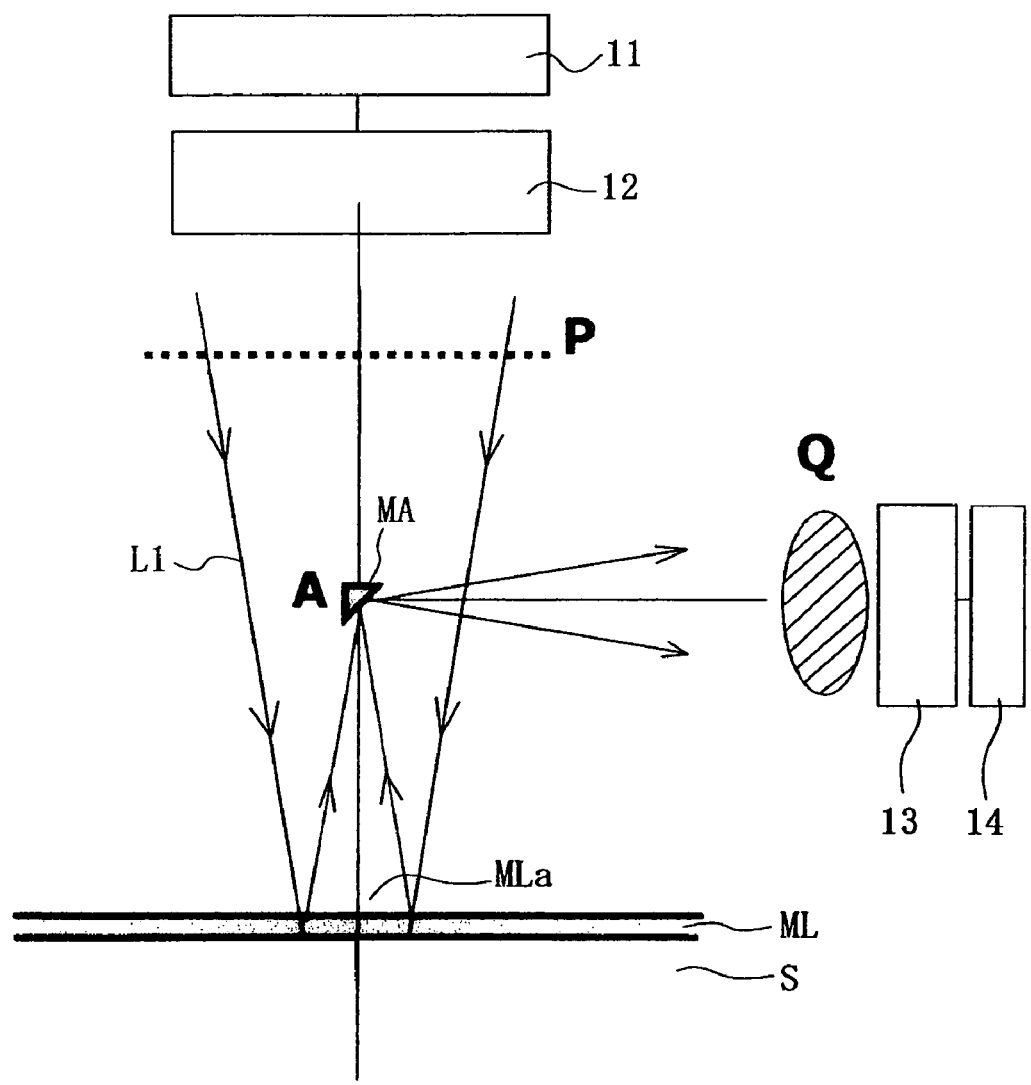
FIG. 6 is a schematic block diagram of principal parts for a phase measuring optical apparatus of a third embodiment according to the present invention.

FIG. 6 is a schematic view showing principal parts of a phase measurement apparatus of a third embodiment according to the present invention.

Compared with the second embodiment, the third embodiment reverses a direction of light incidence on the film ML and reflection from the film ML or transposes the incident side and the reflection side. Other than that, they have the same configuration.

In this embodiment, the convergent light L11 from the condenser optical system 22 enters the multilayer film ML on the object prior to its convergence, and then converges on the point A. The grating P is provided on an optical path of the convergent light L11 to the film ML, and enables a number of diffracted rays of light including high-order beams to enter the film ML. The mirror MA serves to selectively reflect two arbitrary diffracted beams out of these many diffracted beams. Thus, this mirror MA provides spatial frequency filtering to the diffracted beams produced by the grating P, remarkably simplifying the analysis of the interference infringe and improving accuracy as well.

Figure 7:
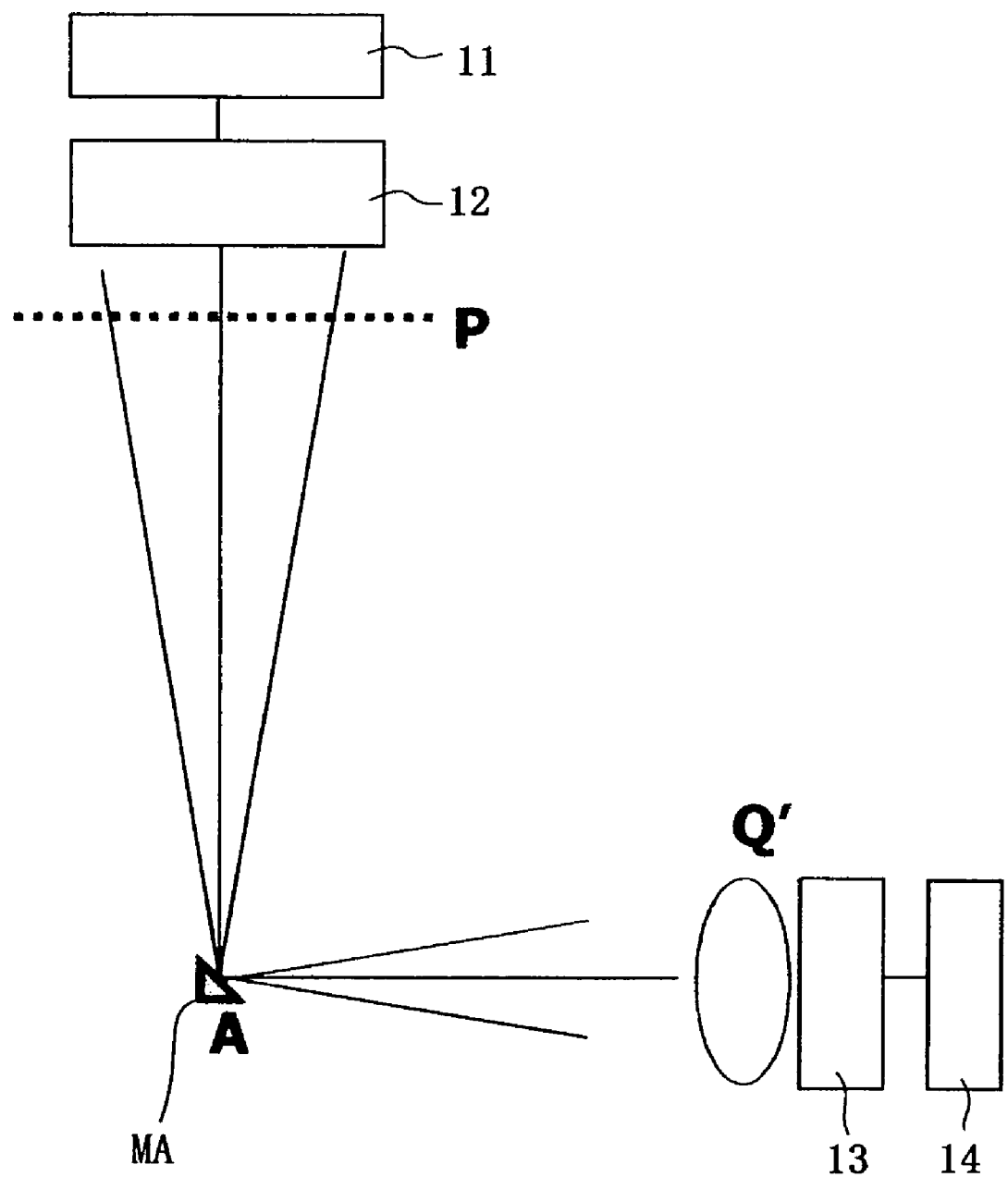
FIG. 7 is a schematic block diagram for explaining a method for calibrating distortion of incident wave of the third embodiment.

This embodiment uses interference information obtained at the point Q' by arranging the grating P and the mirror MA at positions optically equivalent to those shown in FIG. 6, and obtains an offset, as shown in FIG. 7, without introducing light from the condenser optical system 22 to the film ML.

Figure 8:
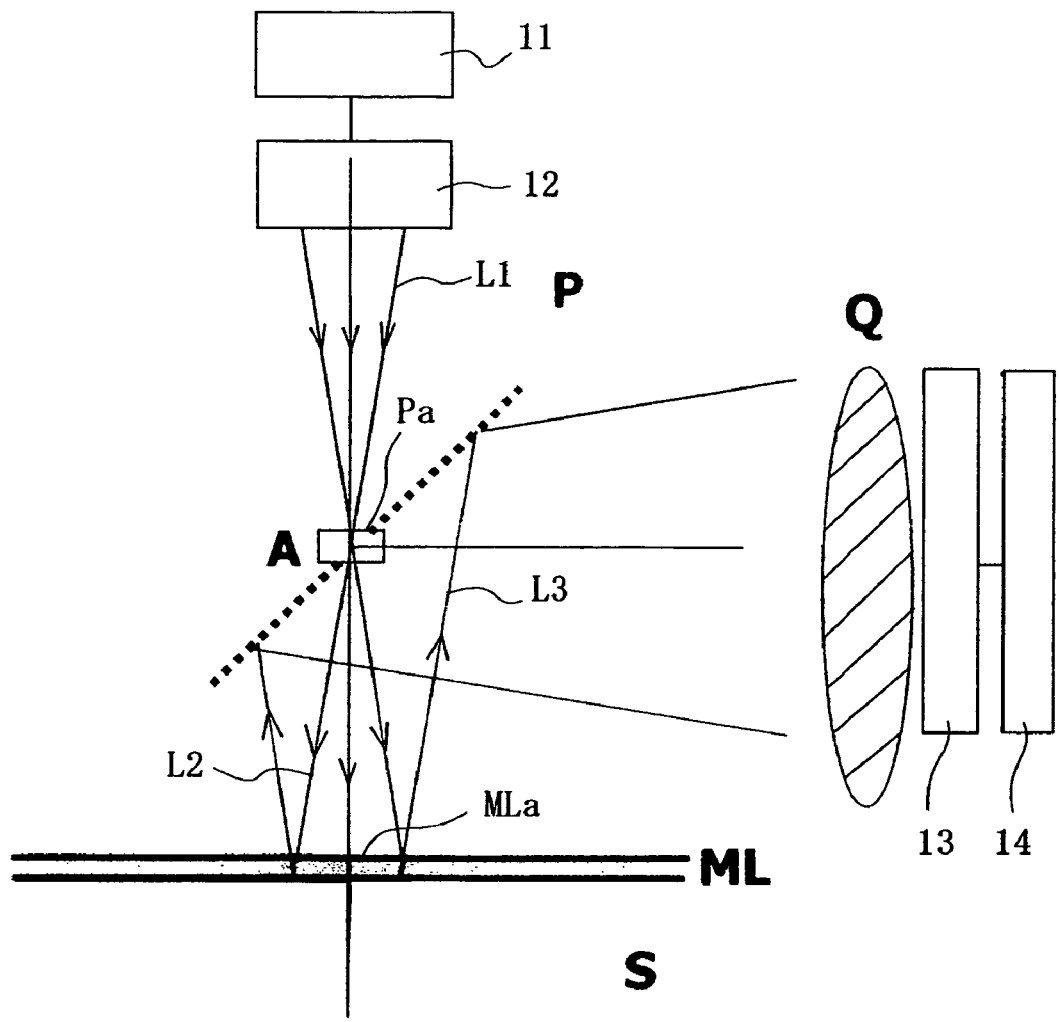
FIG. 8 is a schematic block diagram of principal parts for a phase measuring optical apparatus of a fourth embodiment according to the present invention.

FIG. 8 is a schematic view of principal parts for a phase measuring optical apparatus of a fourth embodiment according to the present invention. In this embodiment, the light L11 condensed by the condenser optical system 22 converges at an aperture Pa in an obliquely arranged grating P.

The light L11 converges at the aperture Pa, and enters as divergent light L12 the film ML. The grating P is obliquely provided as a beam splitter at a position of the aperture Pa as a light L11's condensing point. The light L11 passes through the aperture (or pinhole) Pa at the condensing point without any diffraction. The divergent light L12 that has passed through the aperture Pa is reflected on the object surface MLa, and enters the grating P as the beam splitter while spreading its beam diameter.

The instant embodiment uses reflected light L13 for measurement. The reflected light L13 includes diffracted beams as a result of a diffraction effect of the grating P, and these diffracted beams form shearing-interference fringes. The 0-th order light and $1^{st}$ order light among diffracted wavefronts produced by the grating P forms an interference fringe at the position Q. The phase distribution of a wavefront reflected on the object surface ML is measured by analyzing the interference fringe.

The electric frequency filtering and the like may extract desired interference-fringe information based on concurrent other interference fringes of high order diffracted light produced at the position Q.

Figure 9:
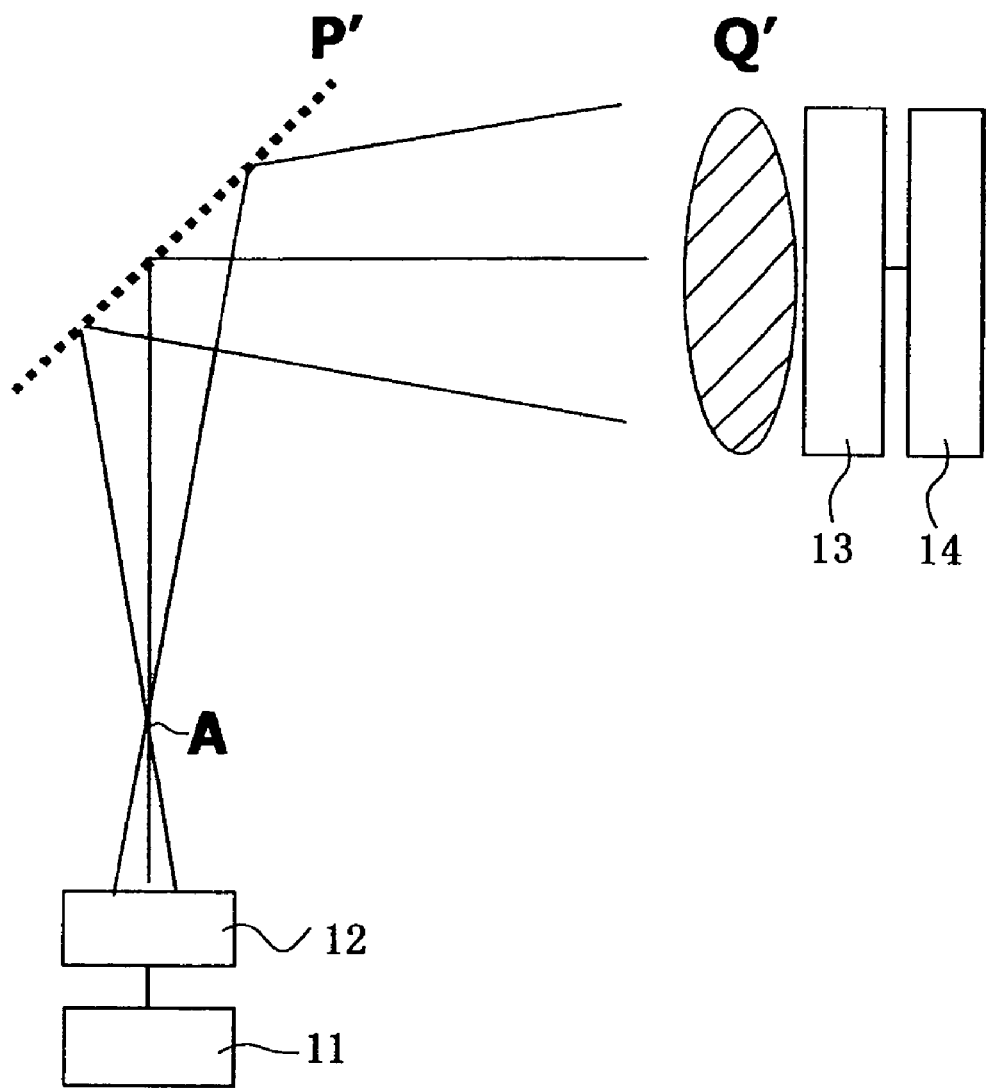
FIG. 9 is a schematic block diagram for explaining a method for calibrating distortion of incident wave of the fourth embodiment.

The instant embodiment forms an interference fringe at the position Q, and obtains an offset, as shown in FIG. 9, without the object ML.

Similar to the foregoing embodiments, the calibration optical system for detecting the offset shown in FIG. 9 is adapted to arrange optical elements and the observation position for the interference fringe optically equivalent to those for the measurement in FIG. 8.

Figure 10:
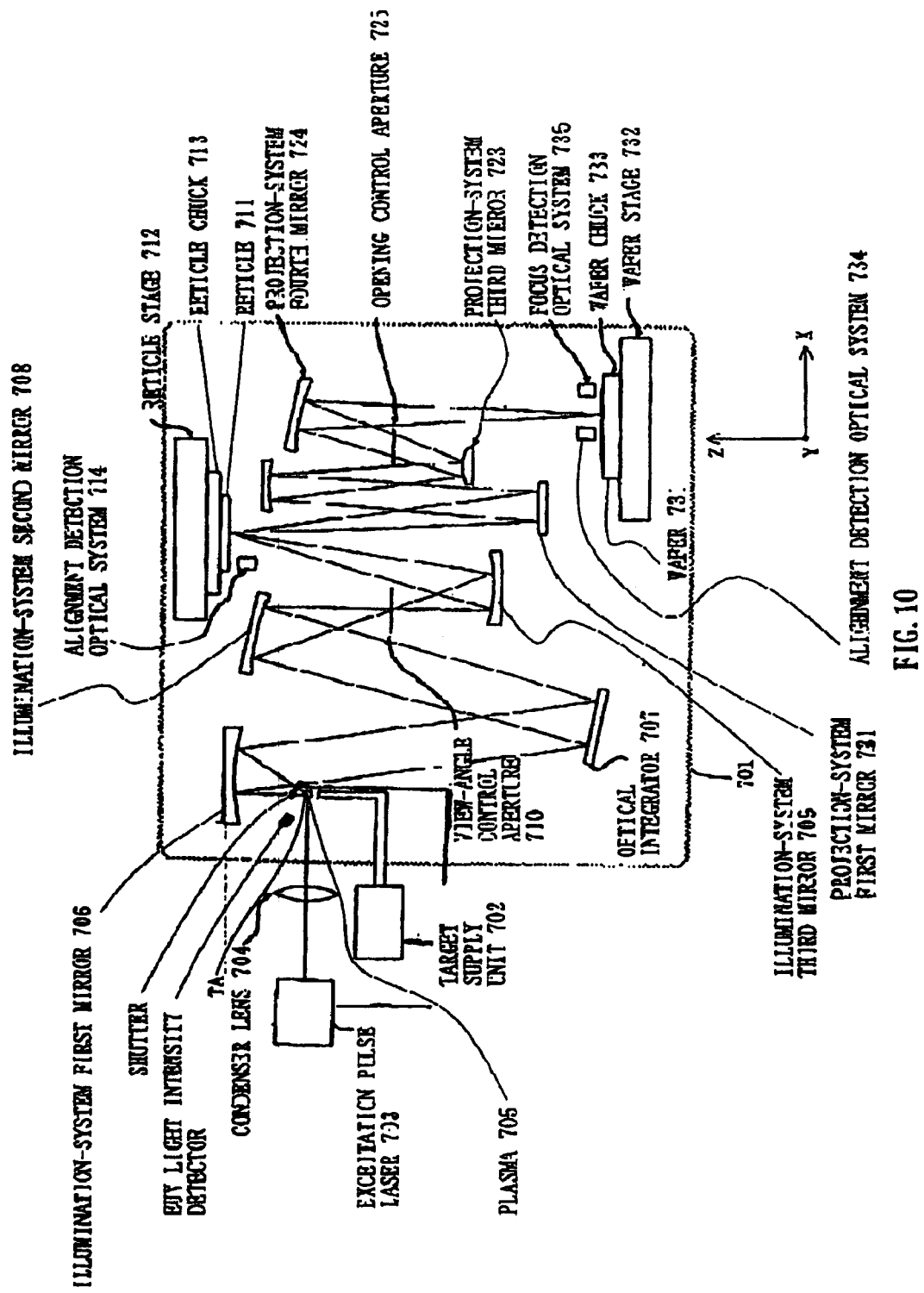
FIG. 10 is a schematic view of principal parts of an exposure apparatus according to the present invention.

FIG. 10 is a schematic view showing principal parts of an EUV exposure apparatus for fabricating devices using light with an EUV wavelength length (10 to 15 nm) as exposure light and one or more mirrors as an object to be measured by the inventive phase measuring apparatus.

The EUV exposure apparatus shown in FIG. 10 includes an EUV light source, an illumination optical system, a reflection type reticle, a projection optical system, a reticle stage, a wafer stage, an alignment optical system, a vacuum system, etc.

The EUV light source of this embodiment uses a laser plasma light source. This irradiates a high-intensity pulse laser beam to a target material TA provided in a vacuum chamber 701, generates high-temperature plasma 705, and emits EUV light from it with a wavelength of, e.g., about 13 nm. The target material may use a metallic thin film, an inert gas, a droplet, etc., which are provided in the vacuum chamber 701 by a target supply unit 702 equipped with a means such as a gas jet and the like. A pulse laser beam is output from the excitation pulse laser 703, and irradiated to the target material TA via the condenser lens 704. In order to raise average intensity of radiated EUV light, the repetitive frequency of the pulse laser should preferably be high, and the excitation pulse laser 703 usually operates at a repetitive frequency of several kHz.

Alternatively, the EUV light source may use a discharge plasma light source, which emits gas around an electrode put in vacuum, applies pulse voltage to the electrode for discharge, and induces high-temperature plasma. This plasma emits the EUV light, for example, with a wavelength of about 13 nm to be utilized. In order to raise average intensity of the radiated EUV light, a repetitive frequency of the electric discharge should preferably be high, and the discharge plasma light source usually operates at a repetitive frequency of several kHz.

An illumination optical system includes plural multilayer films or oblique-incidence mirrors, optical integrators, etc. The illumination optical system of this embodiment includes an illumination-system first mirror 706, an optical integrator 707, an illumination-system second mirror 708, and an illumination-system third mirror 709. These members lead the EUV light radiated from the plasma 705 to a reticle (or mask) 711.

The condenser mirror (or illumination-system first mirror) 706 at the first stage in the illumination optical system serves to collect EUV light radiated in an almost isotropic way from the laser plasma 705. The optical integrator 707 serves to uniformly illuminate the reticle 711 with a predetermined numerical aperture. The illumination optical system includes an aperture 710 having an arc-shaped opening at a position conjugate with the reticle 711 to limit an illuminated area on a reticle surface to the arc shape.

An arc-shaped beam that has passed through the aperture 710 illuminates the reticle 711, and the reflected light illuminates the wafer 731 through the projection optical system including mirrors 721 to 724. Since a mirror with a multilayer film used for the EUV region ("multilayer film mirror") loses a greater amount of light compared to a mirror for visible light, the number of mirrors should be maintained minimum. 725 is a stop for controlling an opening.

This embodiment uses a ring field optical system for using only a thin arc-shaped area (or ring field) apart from the optical axis by a certain distance to realize a projection optical system with the small number of mirrors but a wide exposure area. This embodiment also uses a method of simultaneously and synchronously scanning the reticle 711 and the wafer 731 (i.e., scan exposure) to transfer a broad exposure area. An arc-shaped illumination area on the reticle 711 surface is formed by the optical integrator 707 in the illumination optical system, and the mirrors 708 and 709 before and after it.

The projection optical system also uses a plurality of mirrors. FIG. 10 uses the projection-system first to fourth mirrors 721 to 724 to lead reflected light from the reticle 711 to the wafer 731 mounted on a wafer chuck 733. The smaller number of mirrors would provide higher utilization efficiency of the EUV light, but have a difficulty in correcting aberration. For favorable aberrational correction, the number of mirrors is set to about four to six. The reflection surface of the mirror may be convex, concave or other spherical surfaces, an aspheric surface, a rotational asymmetrical aspheric surface, and the like. The projection optical system has a numerical aperture NA of about 0.1 to 0.3.

Each mirror makes its plate of a rigid and hard material with low coefficients of thermal expansion, such as low expansion coefficient glass or silicon carbide, shapes a predetermined reflection surface through grounding and polishing, and then forms a multilayer film, such as molybdenum/silicon, on the reflection surface. When incident angles are not uniform according to positions on the mirror surface, a multilayer film with a constant film cycle enhances the reflectance depending upon a location and offsets the wavelength of the EUV light, as apparent from the Bragg's equation. Accordingly, a film cycle distribution is arranged so that the EUV light with the same wavelength may be reflected efficiently on a mirror surface.

The reticle stage 712 and the wafer stage 732 serve to scan synchronously with a speed ratio proportional to the demagnification of the projection optical system. A coordinate system assigns the scanning direction on a surface of the reticle 711 or the wafer 732 to an X-axis, the direction orthogonal to that to a Y-axis, and the direction orthogonal to a surface of the reticle or the wafer to a Z-axis.

The reticle 711 is held by the reticle chuck 713 located above the reticle stage 712. The reticle stage 712 has a mechanism to move at a high speed in the direction X, and a fine adjustment mechanism for positioning the reticle 711 in the directions X, Y and Z and in rotational directions around these axes. The position and posture of the reticle stage 712 are measured in a known manner by a laser interferometer (not shown), and controlled based the measurement results.

The wafer 731 is held onto the wafer stage 732 by the wafer chuck 733. Similar to the reticle stage 712, the wafer stage 732 has a mechanism to move at a high speed in the direction X, and a fine adjustment mechanism for positioning the wafer in the directions X, Y and Z, and in rotational directions around these axes. The position and posture of the wafer stage 732 are measured in a known manner (not shown) by a laser interferometer, and controlled based on the measurement results.

In order to detect a relative arrangement between the reticle 711 and the wafer 731, the alignment detecting mechanisms 714 and 734 are used to measure an arrangement between the reticle 711's position and the projection optical system's optical axis, and that between a positional relationship of the wafer 731's position and the projection optical system's optical axis. The positions and angles of the reticle stage 712 and the wafer stage 732 are set such that the reticle 711's projected image may agree with the wafer 731's preset position.

A focus position detecting mechanism 735 for detecting the best imaging position for the projection optical system measures a focus position in the direction z on the wafer surface, and control over a position and angle of the wafer stage 732 maintains the wafer surface at the best imaging position for the projection optical system all the time during exposure.

Once scan exposure ends on the wafer 731, the wafer stage 732 moves stepwise in the directions x and Y for the next scan exposure start position so that the reticle stage 712 and the wafer stage 732 may again synchronously scan in the direction x with a speed ratio proportional to the demagnification of the projection optical system. Thus, a pattern on the reticle 711 is exposed on the wafer 731.

A synchronous scan is thus repeated while an image on the reticle 711 is projected and demagnified on the wafer 731 (i.e., step and scan), and a pattern on the reticle is transferred on the entire surface of the wafer.

Thus, each embodiment uses a simple configuration to accurately measure a phase of an optical thin film formed on the surface of an optical element, even for the nearly normal incidence. Each embodiment does not structurally depend upon a wavelength, and is applicable to any system including even one that extremely limits a type of usable optical element like an EUV system. In addition, a mirror or a pinhole at a convergent point exhibits the spatial frequency filtering effect, and introduces convergent or divergent light nearly perpendicularly to the object, enabling phase characteristics near the normal incidence to be accurately measured.

An optical element that is measured with the above phase measuring apparatus may be incorporated into an exposure apparatus or any other optical apparatus. A device may be fabricated using the steps of exposing an object (such as a wafer) with an exposure apparatus, and developing the exposed object, wherein the exposure apparatus uses the above phase measuring method or apparatus. This device fabrication method includes other various known steps in addition to the above steps.

The present invention may thus provide a phase measuring method and apparatus that may easily and accurately measure position-dependent and angle-dependent phase characteristics of a film applied to a mirror with a curvature and a plane mirror.

What is claimed is:

1. A phase measuring apparatus comprising:
   a reflector for condensing light from a light source with a certain incident angle range, and for introducing the light to a film applied onto an object to be measured;
   a splitting grating for splitting light reflected on the object into multiple beams; and
   a detector for detecting interference information based on two out of the multiple beams split by said splitting grating,
   wherein the interference information is detected based on light which is reflected from the object with the applied film, and
   wherein said phase measuring apparatus obtains, based on the interference information, phase information dependent upon the angle incident upon the film.

2. A phase measuring apparatus according to claim 1, wherein the light incident on the object enters a single spot on the object.

3. A phase measuring apparatus according to claim 1, further comprising a polarization selector to measure phase information in selected polarized light.

4. A phase measuring method comprising the steps of:
   introducing light to substantially one spot on a film applied onto an object to be measured;
   partially differentiating, with respect to an angle of incidence onto the film, phase information dependent upon a position on the film and the angle of incidence by providing light from the one spot with shearing interference respectively; and
   determining phase information dependent on the angle of incidence based on the partially differentiated phase information.

5. A phase measuring method comprising the steps of:
   introducing light to a film as an object to be measured while correlating a position incident on the film and an angle incident on the film with each other;
   measuring a phase distribution of the light from the object utilizing shearing interference; and
   determining phase characteristics dependent on the angle incident based on the measured phase distribution.

6. A phase measuring method according to claim 5, wherein the light incident on the object is convergent or divergent light.

7. A phase measuring method according to claim 5, further comprising the step of comparing a wavefront of the light that has not contacted the object with that of the light that has contacted the object.

8. A phase measuring method according to claim 6, further comprising the step of separating an optical path for incident light from that for outgoing light using a mirror surface or a pinhole provided at a condensing point of the convergent or divergent light to the object.

9. A phase measuring method according to claim 5, further comprising the step of correcting a phase obtained from said phase measuring method, based on a shape of the object that has been measured previously.

10. A phase measuring apparatus comprising:
    a condenser for condensing light from a light source;
    a reflector, provided on a condensing point for the light, for reflecting the light and introducing the light that is divergent light to a film applied onto an object to be measured;
    a grating for diffracting the light that has been reflected on the object; and
    a detector for detecting the interference information based on two beams having offset wavefronts by said grating,
    wherein the interference information is detected based on light which is reflected from the object with the applied film, and
    wherein said phase measuring apparatus obtains, based on the interference information, phase information dependent upon the angle-incident upon the film.

11. A phase measuring apparatus according to claim 10, further comprising a corrector for correcting, based on a shape of the object that has been measured, a phase obtained through a measurement by said phase measuring apparatus.

12. A phase measuring apparatus according to claim 10, wherein said phase measuring apparatus measures phase information of the film using the interference information obtained by said detector in an optically equivalent system without the object.

13. A phase measuring apparatus comprising:

a light source;

a reflector for condensing, at a predetermined range of incident angles, light from said light source onto a predetermined position of an object to measured, the object including a film;

a splitting grating for splitting light reflected on the object into multiple beams; and a detector for detecting interference between two of the multiple beams split by said splitting grating, wherein the interference is detected based on light which is reflected from the object with the applied film, and wherein said phase measuring apparatus obtains phase information dependent upon the incident angles on the film based on interference information obtained by said detector.

14. A phase measuring apparatus according to claim 13, wherein beam incident onto the object is incident onto a point of the object.

15. A phase measuring apparatus according to claim 13, further comprising a polarization sector; and wherein said phase measuring apparatus measures phase information in polarized light selected by said polarization selector.

16. A phase measuring method for measuring phase information dependent on a position on a film applied onto an object to be measured and/or an angle of incidence onto the film, said phase measuring method-comprising the steps of:

introducing light to substantially one spot on the object; and partially differentiating, with respect to the angle, phase information dependent upon the position and the angle by providing light from the one spot with shearing interference; and determining a suitability of the film applied onto the object based on the partially differentiated phase information.

17. A phase measuring method comprising the steps of:

introducing, at a predetermined angle, light having a known phase distribution of a wavefront to a predetermined position of a film as an object to be measured:

measuring a phase distribution of the light from the object utilizing shearing interference;

detecting a phase characteristic dependent on the predetermined angle incident on the film; and determining a suitability of the film on the object based on the detected phase characteristic.

18. A phase measuring method according to claim 17, wherein the light incident on the object is convergent or divergent light.

19. A phase measuring method according to claim 17, further comprising the step of comparing a wavefront of the light that has not contacted the object with that of the light that has contacted the object.

20. A phase measuring method according to claim 17, further comprising the step of separating an optical path for incident light from that for outgoing light using a mirror surface or a pinhole provided at a condensing point of the convergent or divergent light to the object.

* * * * *